Sept. 3, 1963 JUNICHI YASUDA 3,102,987

TUNER HAVING VARIABLE CAPACITANCE DIODE AND SATURABLE INDUCTOR VARIED TOGETHER BY POTENTIOMETER TAP MOVEMENT AND VARIED OPPOSITELY BY BATTERY DRIFT

Filed Sept. 7, 1961 2 Sheets-Sheet 1

INVENTOR.
Junichi Yasuda
BY
Hill, Sherman, Meroni, Gross & Simpson
ATTORNEYS

TUNER HAVING VARIABLE CAPACITANCE DIODE AND SATURABLE INDUCTOR VARIED TOGETHER BY POTENTIOMETER TAP MOVEMENT AND VARIED OPPOSITELY BY BATTERY DRIFT

Filed Sept. 7, 1961 2 Sheets-Sheet 2

INVENTOR.
Junichi Yasuda
BY
Hill, Sherman, Meroni, Gross & Simpson
ATTORNEYS

United States Patent Office 3,102,987

Patented Sept. 3, 1963

3,102,987

TUNER HAVING VARIABLE CAPACITANCE DIODE AND SATURABLE INDUCTOR VARIED TOGETHER BY POTENTIOMETER TAP MOVEMENT AND VARIED OPPOSITELY BY BATTERY DRIFT

Junichi Yasuda, Tokyo, Japan, assignor to Sony Corporation, Tokyo, Japan, a corporation of Japan Filed Sept. 7, 1961, Ser. No. 136,627
Claims priority, application Japan Sept. 12, 1960
2 Claims. (Cl. 334—4)

The present invention relates to a variable tuning device employing a variable inductance device with a variable capacitance.

The usual tuning circuit consists of an inductance element in the form of a coil and a capacitance, either or both of which may be variable. It is more common to make the capacitance the variable element because it is easier to adjust the capacity of a typical capacitor containing a rotor blade and a stator blade than it is to adjust the inductance of the coil.

The present invention provides a variable tuning device in which both the inductance and the capacitance are readily adjustable by electrical means. In the present invention, the inductance is provided by a typical coil arrangement, while the capacitance takes the form of a semiconductor device whose capacitance varies as a function of the voltage impressed across it. Such semiconductors are well known commercially under the name "Varicap." These devices are normally composed of two semiconductor layers of different conductivity types and may be in the form of diodes or transistors.

An object of the present invention is to provide a simple but effective tuning device composed of an inductance coil and a semiconductor device whose capacitance varies as a function of the voltage impressed across it.

Another object of the present invention is to provide a variable tuning device in which the frequency can be varied substantially by joint variation of the inductance and the capacitance elements.

A further object of the present invention is to provide a variable tuning device whose resonant frequency is relatively independent of changes in the power supply voltage.

Other objects, features and advantages of the invention will be fully apparent from the following description taken in conjunction with the accompanying drawings, in which.

Figure 1:
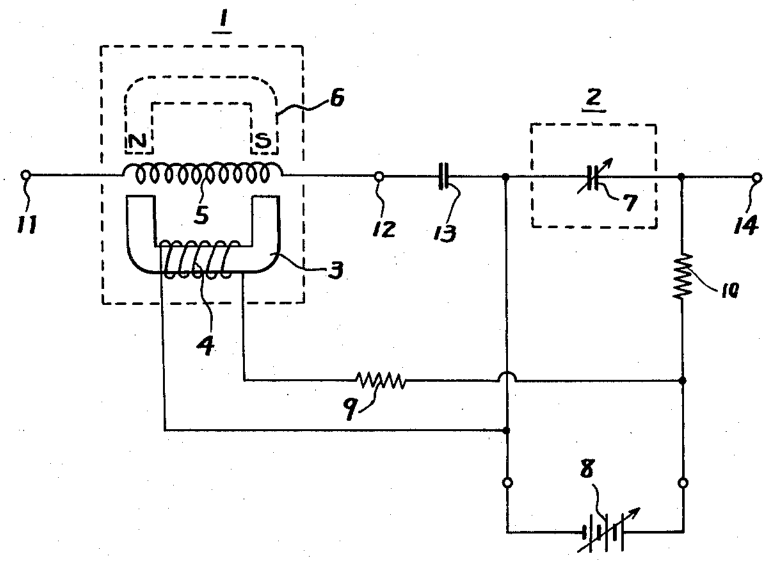
FIGURE 1 is a circuit diagram illustrating one embodiment of a variable tuning device according to the present invention.

In FIGURE 1, reference numerals 1 and 2, respectively, designate an inductance element and a semiconductor device whose capacitance varies as a function of the voltage impressed across it. The inductance device 1 may consist of an iron core 3, an excitation coil 4 wrapped around the core 3, and a signal coil 5. A direct current biasing magnet 6 may be provided, if desired, to bias the core at a particular level of magnetic field strength.

The semiconductor device employed as the variable capacitance element is identified at reference numeral 7. As illustrated, the excitation coil 4 is connected across a variable voltage supply 8 through a current limiting resistor 9. The semiconductor device is connected in parallel to the excitation coil 4, and a limiting resistor 10 may be provided, if necessary, to regulate the current to the semiconductor.

In FIGURE 1, the variable inductance 1 and the variable capacitance 2 are connected in series to form a series oscillation circuit the terminals of which are represented at reference numerals 11 and 14. A coupling capacitor 13 is interposed between the joined sides of the inductance and capacitance elements.

According to the present invention, a voltage E of the power supply 8 is impressed across the variable capacitance element 7 so that the element provides a characteristic capacitance for that particular voltage. At the same time, a current from the power source 8 flows through the resistor 9 to the excitation coil 4, creating an inductance which is governed by the value of the excitation current. By making the voltage of the power source 8 variable, the capacitance of the element 7 and the inductance of the inductance device 1 also become variable so that the resonant frequency of the circuit may be varied over a wide range.

Figure 2:
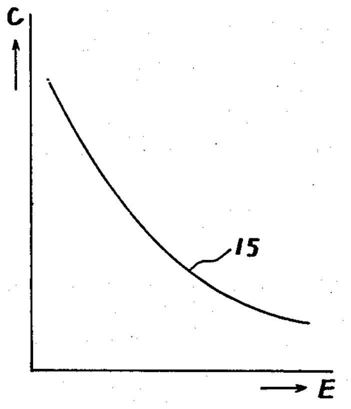
FIGURE 2 is a graph illustrating the capacitance characteristics of the variable capacity element employed.
Figure 3:
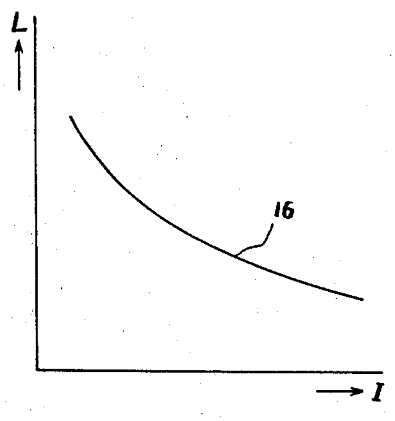
FIGURE 3 is a graph illustrating the inductance characteristics of the variable inductance employed in the circuit of FIGURE 1.

In FIGURE 2, reference numeral 15 illustrates the change of capacitance of the capacitor 7 with increase in voltage, and in FIGURE 3 curve 16 shows the change of inductance of the inductance element 1 upon increase in energizing current. As apparent from these curves, the capacity and the inductance decrease as the voltage of the power source increases with the result that the resonant frequency of the device increases. In the opposite case, when the voltage is decreased at the source, the frequency decreases.

In the form of the invention illustrated in the drawings, a common power source is used for the inductance and the capacitance but it should be apparent that separate power sources may be connected to these elements and that additional power sources may be added, if desired, even when a common power supply is used. The power source is indicated as a battery in FIGURE 1, but it should be recognized that any type of voltage source may be employed.

While the circuit shown in FIGURE 1 is a series resonant circuit, it should also be apparent that the devices can be connected in parallel by connecting the terminals 11 and 14 as one terminal and providing a central terminal 12 intermediate the inductance and capacitance.

Figure 4:
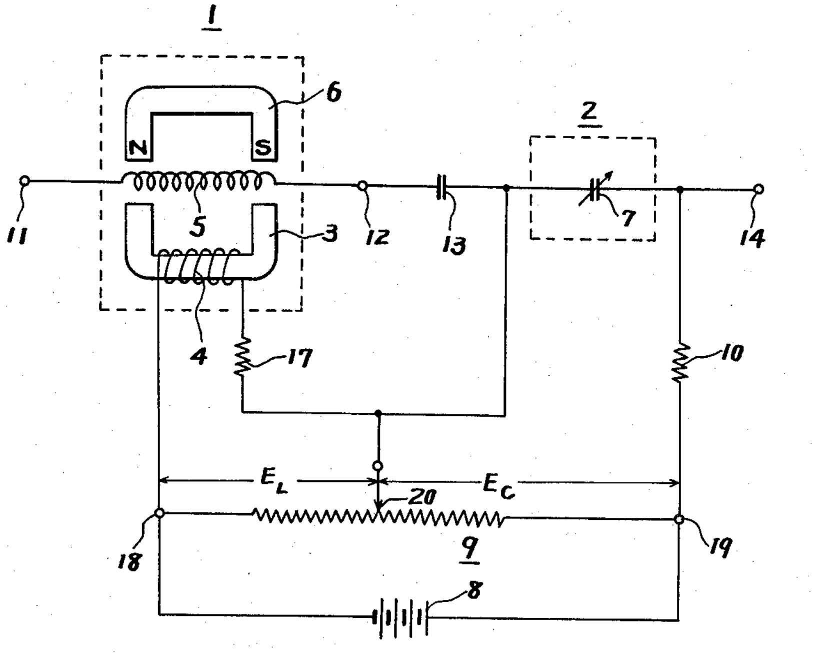
FIGURE 4 is a circuit diagram illustrating another embodiment of a variable tuning device according to the present invention.

In the circuit illustrated in FIGURE 4 there is provided a potentiometer across the power supply 8, the potentiometer having its two end terminals 18 and 19 and a variable arm 20. The terminal 19 is connected to one side of the variable capacitance element 2 through a choke or a resistor 10, and the variable arm 20 is connected intermediate the connection which exists between one side of the excitation coil 4 and the opposite side of the capacitance element 2. A current limiting resistor 17 may be included if required. As illustrated, the other end of the excitation coil 4 is connected to the terminal 18 of the potentiometer. The other connections are identical to those described in connection with FIGURE 1.

In this embodiment, a voltage $E_c$ between the terminal 19 and the variable arm 20 is impressed across the variable capacitance 2. The coil 4 is energized by a current $I_L$ obtained by the application of the potential $E_L$ existing between terminal 18 and the variable arm 20 and producing a current determined by the size of the resistor 17.

Figure 5:
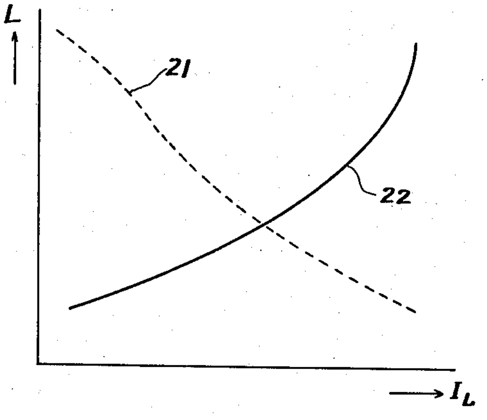
FIGURE 5 is a graph illustrating the inductance characteristics of the inductance employed in the circuit of FIGURE 4.

When the inductance element 1 is biased in one direction by the magnet 6, its inductance L may be lowered by increasing the excitation current $I_L$ as shown by the dotted line 21 in FIGURE 5. If, however, the device is used in the reverse biased condition, the inductance L rises in accordance with the increase in the current $I_L$, as shown by the full line curve 22 in FIGURE 5.

Figure 6:
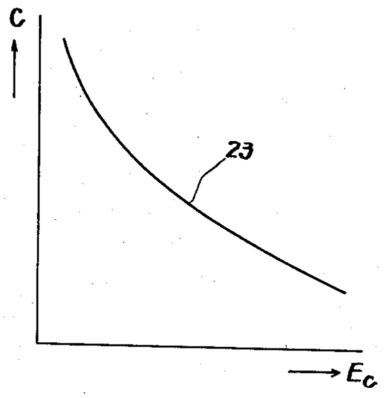
FIGURE 6 is a capacitance curve of the capacitance element employed in the circuit of FIGURE 4.

At the same time, the capacity C of the capacitance device 2 decreases as the impressed voltage $E_c$ applied across that element increases, as shown by the curve 23 in FIGURE 6. Accordingly, as the variable arm 20 is shifted toward the terminal 19 the voltage $E_c$ becomes smaller and the capacity C of the capacitance device 2 increases. At the same time, the current $I_L$ increases, causing the inductance L to increase under these conditions of bias.

As the variable arm 20 is moved toward the terminal 18, the frequency rises. If the voltage of the power source should vary for same reason, with this type of arrangement, unlike that in FIGURE 1, the frequency will be held more or less constant. In other words, an increase in the supply voltage will cause a decrease in the capacity but that will be offset by an increase in the inductance. Accordingly, the device can be operated in a predetermined tuning frequency range in spite of variations in the voltage of the power supply.

It should be evident that various modifications and variations can be made without departing from the novel concepts of the present invention.

I claim as my invention:

1. A variable tuning device comprising a wound inductance having an excitation coil thereon, magnetic means biasing said inductance to increase the inductive reactance of said inductance upon an increase in energizing current through said excitation coil, a semi-conductor device whose capacitance decreases with an increase in voltage across said device, said semi-conductor device having one side connected to one side of said inductance, a variable power supply, means connecting said power supply across said excitation coil of said inductance, and means connecting said power supply across said semi-conductor device.

2. A variable tuning device comprising an inductance, magnetic means biasing said inductance so that its inductance value increases upon an increasing current through the inductance, a semiconductor device whose capacitance varies as a function of the voltage inmpressed across it having one side connected to one side of said inductance, a power supply, a potentiometer connected across said power supply, means connecting one side of said potentiometer to the other side of said inductance, means connecting the other side of said potentiometer to the other side of said semiconductor device, and means connecting the variable arm with said potentiometer to the connection between said inductance and said semiconductor device.

References Cited in the file of this patent

UNITED STATES PATENTS 3,010,015 Pepperberg ------------- Nov. 21, 1961

OTHER REFERENCES

Burnell, "Variable Toroidal Inductors New Electronic Components," Tele-Tech & Electronics Industries, October 1954, pages 68, 128 and 129.

Turner, "Using the Varicap" Radio Electronics, May 1958, pages 58–59.